(12) United States Patent
Sawada et al.

(10) Patent No.: US 11,923,760 B2
(45) Date of Patent: Mar. 5, 2024

(54) SWITCHING POWER SUPPLY APPARATUS FOR REDUCING COMMON MODE NOISE DUE TO LINE-TO-GROUND CAPACITANCES

(71) Applicant: Panasonic Intellectual Property Management Co., Ltd., Osaka (JP)

(72) Inventors: Naoki Sawada, Osaka (JP); Taiki Nishimoto, Osaka (JP); Noriaki Takeda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 236 days.

(21) Appl. No.: 17/442,903

(22) PCT Filed: Feb. 12, 2020

(86) PCT No.: PCT/JP2020/005358
§ 371 (c)(1),
(2) Date: Sep. 24, 2021

(87) PCT Pub. No.: WO2020/195274
PCT Pub. Date: Oct. 1, 2020

(65) Prior Publication Data
US 2022/0200463 A1  Jun. 23, 2022

(30) Foreign Application Priority Data
Mar. 25, 2019  (JP) .................................. 2019-056858

(51) Int. Cl.
*H02M 1/12* (2006.01)
*H02M 1/44* (2007.01)
(Continued)

(52) U.S. Cl.
CPC .............. *H02M 1/123* (2021.05); *H02M 1/44* (2013.01); *H02M 3/01* (2021.05); *H02M 3/33573* (2021.05)

(58) Field of Classification Search
CPC .......... H02M 1/123; H02M 1/44; H02M 3/01; H02M 3/33573; H03H 7/427; H03H 7/4811; H03H 7/4826
See application file for complete search history.

(56) References Cited

U.S. PATENT DOCUMENTS 5,684,678 A    11/1997  Barrett
10,003,267 B1 *  6/2018  Zhao ................. H02M 3/33573
(Continued)

FOREIGN PATENT DOCUMENTS

| JP | 2004-040923 A | 2/2004 |
| JP | 2013-168870 A | 8/2013 |
| WO | 2017/061091 A1 | 4/2017 |

OTHER PUBLICATIONS

B.J. Skromme, Teaching Series and Parallel Connections, , Aug. 3, 2022, vol. 65, p. 3 (Year: 2022).*
(Continued)

*Primary Examiner* — Thienvu V Tran
*Assistant Examiner* — Johana Dumeng-Roman
(74) *Attorney, Agent, or Firm* — Rimon P.C.

(57) ABSTRACT

A switching power supply apparatus has a line-to-ground capacitance C31 between a first winding terminal of a transformer and a conductor portion, and a line-to-ground capacitance C32 between a second winding terminal of the transformer and the conductor portion. The switching power supply apparatus is provided with a capacitor being connected between a first output terminal of a switching circuit and the first winding terminal of the transformer, and a capacitor being connected between a second output terminal of the switching circuit and the second winding terminal of
(Continued)

the transformer. Capacitances of the capacitors C21, C22 are set to satisfy: C21>C22, for C31>C32; C21=C22, for C31=C32; and C21<C22, for C31<C32.

6 Claims, 10 Drawing Sheets

(51) Int. Cl.
    *H02M 3/00*     (2006.01)
    *H02M 3/335*     (2006.01)

(56) References Cited

U.S. PATENT DOCUMENTS

| | | |
|---|---|---|
| 2016/0006271 A1 | 1/2016 | Ichikawa et al. |
| 2017/0370993 A1* | 12/2017 | Weinberg ............... G01R 31/40 |
| 2018/0175735 A1 | 6/2018 | Zhao et al. |
| 2018/0205309 A1 | 7/2018 | Bleus et al. |

OTHER PUBLICATIONS

Extended European Search Report dated Apr. 7, 2022 issued in the corresponding European Patent Application No. 20777694.9.
International Search Report issued in International Patent Application No. PCT/JP2020/005358, dated May 12, 2020; with English translation.
English translation International Preliminary Report on Patentability issued in International Patent Application No. PCT/JP2020/005358, dated Oct. 7, 2021.
European Office Action dated Aug. 10, 2023 issued in the corresponding European Patent Application No. 20777694.9.

* cited by examiner

US 11,923,760 B2

SWITCHING POWER SUPPLY APPARATUS FOR REDUCING COMMON MODE NOISE DUE TO LINE-TO-GROUND CAPACITANCES

CROSS-REFERENCE OF RELATED APPLICATIONS

This application is the U.S. National Phase under 35 U.S.C. § 371 of International Patent Application No. PCT/JP2020/005358, filed on Feb. 12, 2020, which in turn claims the benefit of Japanese Application No. 2019-056858, filed on Mar. 25, 2019, the entire disclosures of which Applications are incorporated by reference herein.

TECHNICAL FIELD

The present disclosure relates to a switching power supply apparatus.

BACKGROUND ART

Conventionally, as a sort of switching power supply apparatus, DC-DC converters for converting a given DC voltage to a desired DC voltage are used. In particular, insulated DC-DC converters are used for industrial, on-board, or medical apparatuses required to be safe, such a converter including a transformer by which an input and an output of the DC-DC converter are insulated from each other, thus preventing electric leakage and electric shock.

Patent Document 1 discloses a switching power supply circuit provided with: a full-bridge switching circuit for converting a DC voltage into an AC voltage at a predetermined frequency by switching; and a transformer for converting the switched AC voltage to a predetermined voltage. Between the switching circuit and the transformer, a plurality of resonant circuits are provided, each including a capacitor and a coil connected in series, and connected to either end of a primary winding of the transformer. The switching power supply circuit of Patent Document 1 constitutes an LLC-resonant insulated DC-DC converter.

CITATION LIST

Patent Documents

PATENT DOCUMENT 1: Japanese Patent Laid-open Publication No. JP 2004-040923 A

SUMMARY OF INVENTION

Technical Problem

Patent Document 1 discloses that the plurality of series resonant circuits are connected to both ends of the primary winding of the transformer, respectively, so as to make voltage waveforms in the primary winding of the transformer symmetric, thus cancelling common mode voltages inputted to the primary winding of the transformer. In other words, Patent Document 1 aims to reduce common mode noises, by establishing symmetry between characteristics of circuit elements connected to one end of the primary winding of the transformer, and characteristics of circuit elements connected to the other end thereof. However, even when configuring the circuit elements with symmetric characteristics, asymmetry of the circuit may occur due to parasitic capacitances (also referred to as "line-to-ground capacitances" in the present specification) between the circuit elements and other conductor portions (such as ground conductor and/or housing), and the like. A common mode noise may occur due to such asymmetry of the circuit. Hence, there is a need for a switching power supply apparatus less likely to generate a common mode noise due to line-to-ground capacitances.

An object of the present disclosure is to provide a switching power supply apparatus less likely to generate a common mode noise due to line-to-ground capacitances.

Solution to Problem

According to an aspect of the present disclosure, a switching power supply apparatus is provided with: a switching circuit, a transformer; and a conductor portion. The switching circuit includes a plurality of switching elements that form a bridge circuit. The switching circuit has first and second output terminals from which an AC voltage having a predetermined frequency is outputted, the AC voltage being converted from an inputted DC voltage. The transformer has a primary winding having first and second winding terminals to which the AC voltage generated by the switching circuit is applied. The switching power supply apparatus has a first line-to-ground capacitance between the first winding terminal of the transformer and the conductor portion, and a second line-to-ground capacitance between the second winding terminal of the transformer and the conductor portion. The switching power supply apparatus is further provided with first and second capacitors, the first capacitor being connected between the first output terminal of the switching circuit and the first winding terminal of the transformer, and the second capacitor being connected between the second output terminal of the switching circuit and the second winding terminal of the transformer. Capacitances of the first and the second capacitors are set to satisfy: $C21 > C22$, for $C31 > C32$; $C21 = C22$, for $C31 = C32$; and $C21 < C22$, for $C31 < C32$. $C31$ denotes the first line-to-ground capacitance, $C32$ denotes the second line-to-ground capacitance, $C21$ denotes capacitance of the first capacitor, and $C22$ denotes capacitance of the second capacitor.

Advantageous Effects of Invention

According to the aspect of the present disclosure, it is possible to provide a switching power supply apparatus less likely to generate a common mode noise due to line-to-ground capacitances.

DESCRIPTION OF EMBODIMENTS

Hereinafter, embodiments of the present disclosure will be described with reference to the attached drawings. Note that in the following embodiments, similar constituents are denoted by the same reference signs.

First Embodiment

Figure 1:
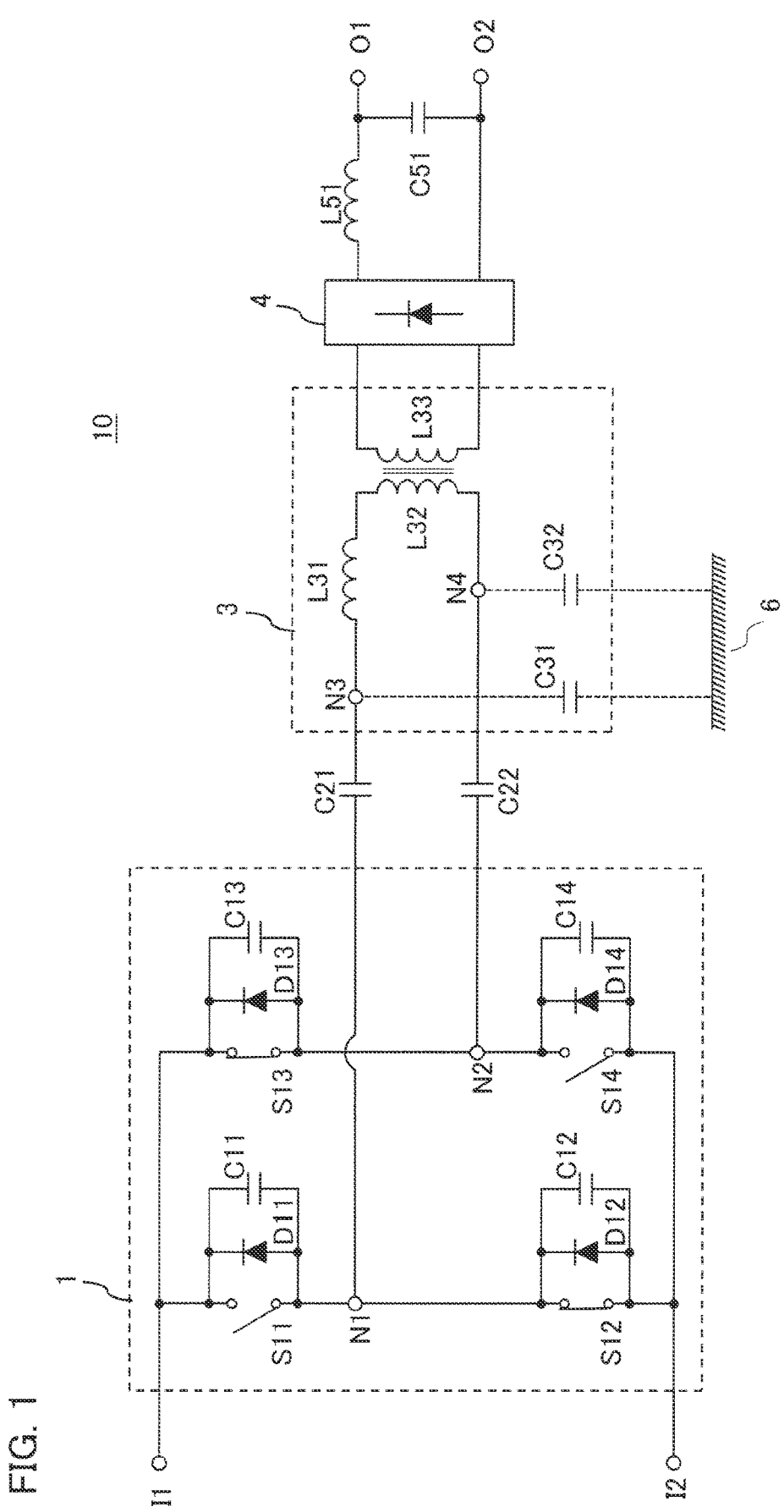
FIG. 1 is a circuit diagram illustrating a configuration of a switching power supply apparatus according to a first embodiment.

FIG. 1 is a circuit diagram illustrating a configuration of a switching power supply apparatus according to a first embodiment. The switching power supply apparatus of FIG. 1 includes an insulated DC-DC converter 10. The insulated DC-DC converter 10 is provided with: a full-bridge switching circuit 1, a resonant capacitor C21, a resonant capacitor C22, a transformer 3, a rectifier circuit 4, a smoothing inductor L51, a smoothing capacitor C51, and a conductor portion 6.

The switching circuit 1 is provided with: switching elements S11 to S14; and diodes D11 to D14 and capacitors C11 to C14, which are connected in parallel to the switching elements S11 to S14, respectively. The switching elements S11 and S12 are connected in series between input terminals I1 and I2 of the switching circuit 1. The switching elements S13 and S14 are connected in series between the input terminals I1 and I2 of the switching circuit 1, and connected in parallel to the switching elements S11 and S12. The switching elements S11 to S14 form a full-bridge switching circuit, with the switching elements S11 and S14 arranged diagonally, and with the switching elements S12 and S13 arranged diagonally. The switching circuit 1 converts a DC voltage, which is inputted from the input terminals I1 and I2, into an AC voltage having a predetermined frequency, and outputs the AC voltage to nodes N1 and N2, the node N1 being located between the switching elements S11 and S12, and to the node N2 being located between the switching elements S13 and S14.

For example, in a case where the switching elements are MOSFETs, the diodes D11 to D14 and the capacitors C11 to C14 may be configured by parasitic diodes (body diodes) and junction capacitances (drain-source capacitances) of the switching elements S11 to S14, respectively.

In the present specification, the node N1 is also referred to as a "first output terminal" of the switching circuit 1, and the node N2 is also referred to as a "second output terminal" of the switching circuit 1.

The transformer 3 has a primary winding and a secondary winding. The primary winding has nodes N3 and N4 to which the AC voltage generated by the switching circuit 1 is applied. At the secondary winding, an AC voltage, which is boosted or stepped down depending on a turns ratio, is generated. Referring to FIG. 1, L31 denotes leakage inductance on the primary side, L32 denotes excitation inductance on the primary side, and L33 denotes inductance on the secondary side.

In the present specification, the node N3 at one end of the primary winding of the transformer 3 is also referred to as a "first winding terminal", and the node N4 at the other end of the primary winding of the transformer 3 is also referred to as a "second winding terminal".

The resonant capacitor C21 is connected between the node N1 of the switching circuit 1 and the node N3 of the primary winding of the transformer 3. The resonant capacitor C21 and the inductances L31, L32 on the primary side of the transformer 3 form an LLC resonant circuit. Similarly, the resonant capacitor C22 is connected between the node N2 of the switching circuit 1 and the node N4 of the primary winding of the transformer 3. The resonant capacitor C22 and the inductances L31, L32 on the primary side of the transformer 3 form an LLC resonant circuit. As a result of resonance of the resonant capacitors C21, C22 and the inductances L31, L32 on the primary side of the transformer 3, the current having a sinusoidal waveform flows.

In the present specification, the resonant capacitor C21 is also referred to as a "first capacitor", and the resonant capacitor C22 is also referred to as a "second capacitor".

The rectifier circuit 4 is connected to the secondary winding of the transformer 3, and rectifies an AC voltage outputted from the secondary side of the transformer 3. The rectifier circuit 4 is, for example, a diode bridge circuit.

The smoothing inductor L51 and the smoothing capacitor C51 form a smoothing circuit, which smooths the voltage rectified by the rectifier circuit 4, and generates a desired DC voltage between the output terminals O1, O2.

The conductor portion 6 is, for example, a ground conductor (for example, a GND wiring of a circuit board), or a metal housing, a shield, or a heat sink. When the conductor portion 6 is provided separately from the ground conductor of the circuit (that is, when the conductor portion 6 is a metal housing, a shield, or a heat sink), a voltage potential of the conductor portion 6 may be the same as, or different from that of the ground conductor of the circuit.

The isolated DC-DC converter 10 has a first line-to-ground capacitance C31 between the node N3 of the primary winding of the transformer 3 and the conductor portion 6, and a second line-to-ground capacitance C32 between the node N4 of the primary winding of the transformer 3 and the conductor portion 6. The line-to-ground capacitances C31 and C32 are parasitic capacitances between the conductor portion 6 and the nodes N3, N4 at both ends of the primary winding of the transformer 3, respectively. The line-to-ground capacitances C31 and C32 varies depending on the structure of the transformer 3 and/or arrangement of the shield, and are not determined a priori. Hence, in general, the line-to-ground capacitances C31 and C32 at both ends of the primary winding of the transformer 3 differ from each other (that is, they are asymmetric).

According to the configuration of FIG. 1, since the resonant capacitors C21 and C22 are connected to both ends of the primary winding of the transformer 3, the waveforms of the voltage potentials at both ends of the primary winding of the transformer 3 are made more symmetric, as compared with a case where a resonant capacitor is connected to only one end, and therefore, it is possible to reduce variation in an average of the voltage potentials at both ends of the primary winding of the transformer 3. In particular, the variation in the average of the voltage potentials at both ends of the primary winding of the transformer 3 is minimized, by setting, to the resonant circuits at both ends of the primary winding of the transformer 3, identical circuit constants determining resonance frequencies of these resonant circuits (that is, the capacitances of the resonant capacitors C21 and C22). Further, when the variation in the average of the voltage potentials at both ends of the primary winding of the transformer 3 is minimized, it is expected that the common mode noise propagating through the line-to-ground capacitances C31, C32 and the conductor portion 6 to external circuits is reduced. However, in practice, different (i.e., asymmetric) line-to-ground capacitances C31 and C32 may occur depending on the structure of the transformer 3 and/or the arrangement of the shield, and such asymmetry of the line-to-ground capacitances C31 and C32 may result in the common node noise. Even in a case where the voltage potentials at both ends of the primary winding of the transformer 3 have symmetrical waveforms by connecting the resonant capacitors C21 and C22 with the same capacitance, since the line-to-ground capacitances C31 and C32 are asymmetric, the currents flowing through the line-to-ground capacitances C31 and C32 have asymmetric waveforms, and a difference between these currents propagates through the conductor portion 6 to external circuits, thus resulting in the common mode noise. That is, since the line-to-ground capacitances C31 and C32 are asymmetric, the resonant capacitors C21 and C22 with the same capacitance can not sufficiently reduce noises, or rather degrading the noise characteristic.

Each of embodiments of the present disclosure provides a switching power supply apparatus less likely to generate the common mode noise due to the line-to-ground capacitances C31 and C32, in consideration of the asymmetry of the line-to-ground capacitances C31 and C32, through configuration for cancelling such asymmetry.

Figure 2:
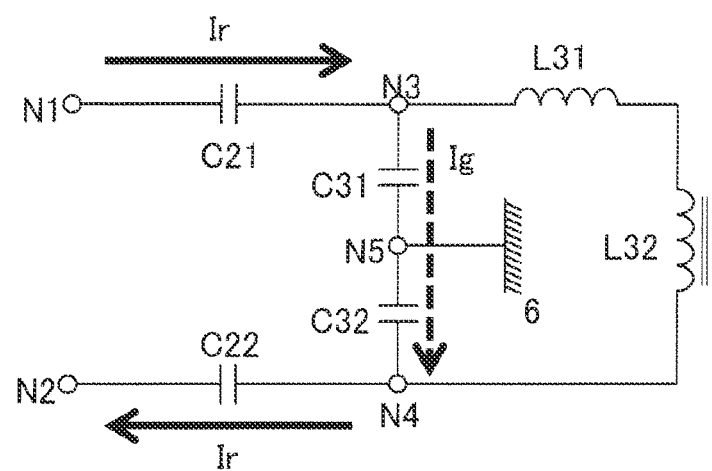
FIG. 2 is a circuit diagram for explaining currents flowing through line-to-ground capacitances C31 and C32 of FIG. 1.

FIG. 2 is a circuit diagram for explaining currents flowing through the line-to-ground capacitances C31 and C32 of FIG. 1. FIG. 2 illustrates the resonant capacitors C21 and C22 and the primary side of the transformer 3, excerpted from the switching power supply apparatus of FIG. 1. N5 denotes a node of the line-to-ground capacitances C31 and C32, on the side of the conductor portion 6. If currents flowing through the line-to-ground capacitances C31 and C32 are different from each other, then according to the Kirchhoff's current law, their difference current propagates from the node N5 to the conductor portion 6, and flows to external circuits, thus resulting in the common mode noise. Therefore, in order to reduce the common mode noise, the current flowing from the node N3 to the node N5 through the line-to-ground capacitance C31 should be equal to the current flowing from the node N5 to the node N4 through the line-to-ground capacitance C32. Now, let Ig be the current flowing through both the line-to-ground capacitances C31 and C32, and assume that the voltage potential of the conductor portion 6 is zero. In this case, a voltage potential V3 at the node N3 and a voltage potential V4 at the node N4 are given by Equations (1) and (2), respectively.

$$|V3|=Ig/(\omega \times C31) \quad (1)$$

$$|V4|=Ig/(\omega \times C32) \quad (2)$$

In addition, since the current does not propagate through the conductor portion 6 to external circuits, the currents flowing through the resonant capacitors C21 and C22 are equal to each other. The voltage potentials at the nodes N1 and N2 are smaller than the voltage potentials at the nodes N3 and N4, which are amplified through resonance. Therefore, by approximating the voltage potentials to zero, the voltage potentials V3 and V4 are given by Equations (3) to (4), respectively, with use of current Ir flowing through both the resonant capacitors C21 and C22.

$$|V3|=Ir/(\omega \times C21) \quad (3)$$

$$|V4|=Ir/(\omega \times C22) \quad (4)$$

Equations (1) to (4) teach that |V3|/|V4|=C32/C31=C22/C21 will suffice to reduce the common mode noise. That is, the ratio of the capacitances of the resonant capacitors C21 and C22 (C21:C22) is set to be equal to the ratio of the line-to-ground capacitances C31 and C32 (C31:C32). In this case, it is possible to reduce the common mode noise, without allowing the current flowing through the capacitors C31 and C32 to propagate from the conductor portion 6 to external circuits.

Hence, according to the switching power supply apparatus of the first embodiment, the common node noise can be made less likely to occur, by setting the capacitances of the resonant capacitors C21 and C22 in consideration of the asymmetry of the line-to-ground capacitances C31 and C32 at both ends of the primary winding of the transformer 3. Thus, it is possible to reduce the number of components for reducing the common mode noise, and reduce the size and cost of the switching power supply apparatus.

Figure 3:
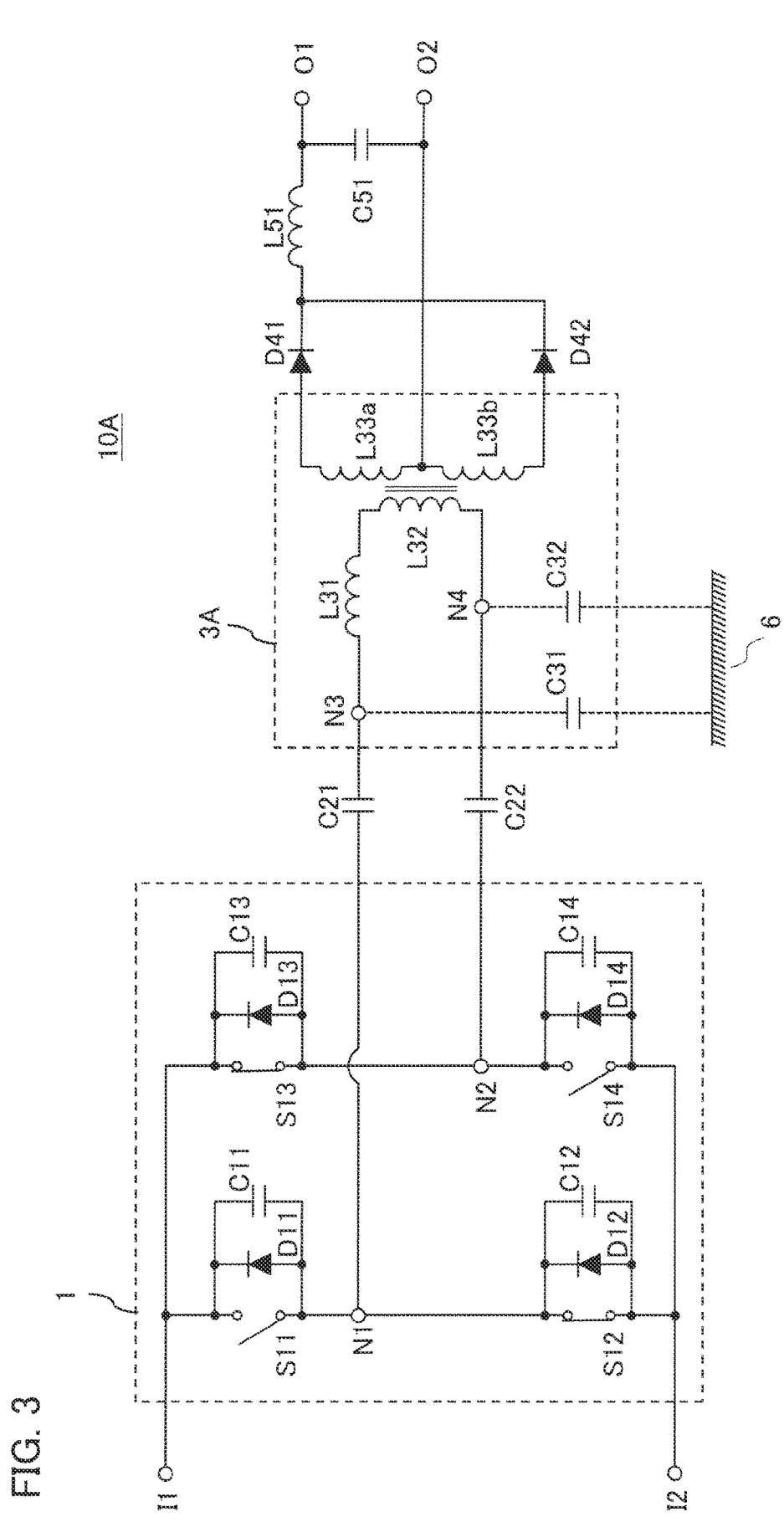
FIG. 3 is a circuit diagram illustrating a configuration of a switching power supply apparatus according to a modified embodiment of the first embodiment.

FIG. 3 is a circuit diagram illustrating a configuration of a switching power supply apparatus according to a modified embodiment of the first embodiment. The switching power supply apparatus of FIG. 3 includes an isolated DC-DC converter 10A. The isolated DC-DC converter 10A of FIG. 3 is provided with a transformer 3A and rectifier diodes D41 and D42, in place of the transformer 3 and the rectifier circuit 4 of FIG. 1. As illustrated in FIG. 3, the switching power supply apparatus according to the first embodiment may be provided with a transformer 3A having a center tap on the secondary side. L33a and L33b denote inductances on the secondary side. Also for the switching power supply apparatus of FIG. 3, the capacitances of the resonant capacitors C21 and C22 can be set, in a manner similar to that of the switching power supply apparatus of FIG. 1.

Next, circuit simulations were performed in order to verify the substantial configuration of the switching power supply apparatus according to the first embodiment.

Figure 4:
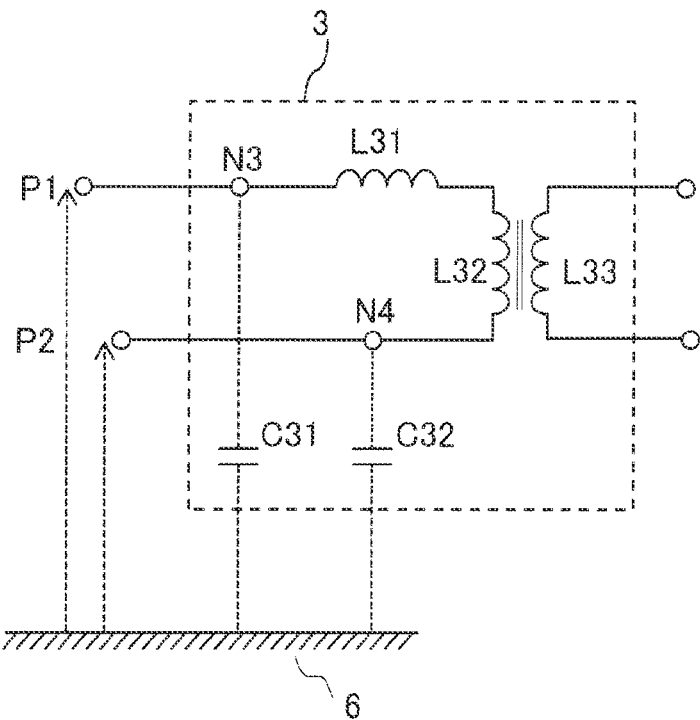
FIG. 4 is a circuit diagram for explaining determination of line-to-ground capacitances C31 and C32 of FIG. 1.

FIG. 4 is a circuit diagram for explaining determination of the line-to-ground capacitances C31 and C32 of FIG. 1. With respect to the switching power supply apparatus according to the first embodiment, at first, it is important, to accurately estimate the line-to-ground capacitances C31 and C32 at both ends of the primary winding of the transformer 3. The line-to-ground capacitances C31 and C32 can be estimated using a network analyzer to measure two-port S parameters of ports P1 and P2 corresponding to the nodes N3 and N4 at both end of the primary winding of the transformer 3, respectively, with the secondary side of the transformer 3 being opened.

Figure 5:
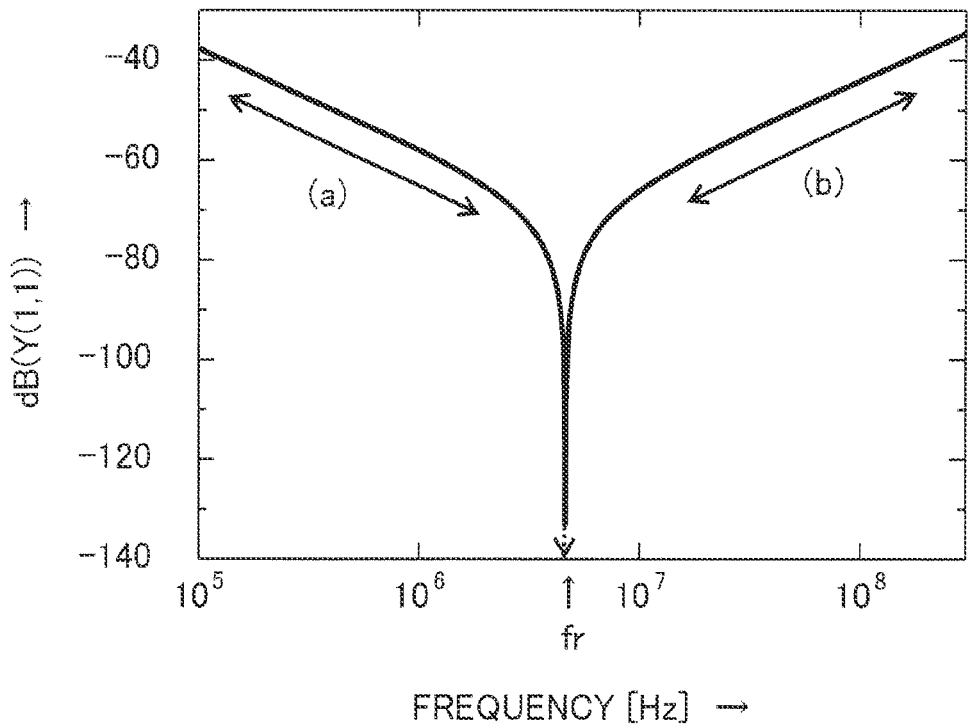
FIG. 5 is a graph illustrating frequency characteristics of an element Y(1,1) of an admittance matrix calculated for the circuit of FIG. 4.

FIG. 5 is a graph illustrating frequency characteristics of an element Y(1,1) of an admittance matrix calculated for the circuit of FIG. 4. With respect to the circuit of FIG. 4, the inductance L (=L31+L32) on the primary side of the transformer 3 was set to 120 μH, and the line-to-ground capacitances C31 and C32 were set to 10 pF and 5 pF, respectively. In this case, an S-parameter matrix of the circuit of FIG. 4 was calculated, and then, the S-parameter matrix was converted into an admittance matrix to obtain the characteristics of FIG. 5. Referring to FIG. 5, in a frequency range (a) below an antiresonant frequency fr, the circuit presents inductive characteristics due to the inductances L31+L32 of the transformer 3; meanwhile in a frequency range (b) above the antiresonant frequency fr, the circuit presents capacitive characteristics due to the line-to-ground capacitances C31 and C32 of the transformer 3. Hence, the line-to-ground capacitance C31 is estimated by C31=imag(Y(1,1)/(2πf)), on the basis of the characteristics of the element Y(1,1) of the admittance matrix in the frequency range (b) above the anti-resonance frequency fr, where imag(A) denotes an imaginary part of A, and f denotes frequency. Similarly, the line-to-ground capacitance C32 is estimated by C32=imag (Y(2,2)/(2πf)), on the basis of the characteristics of the element Y(2,2) of the admittance matrix in the frequency range above the antiresonant frequency fr.

Figure 6:
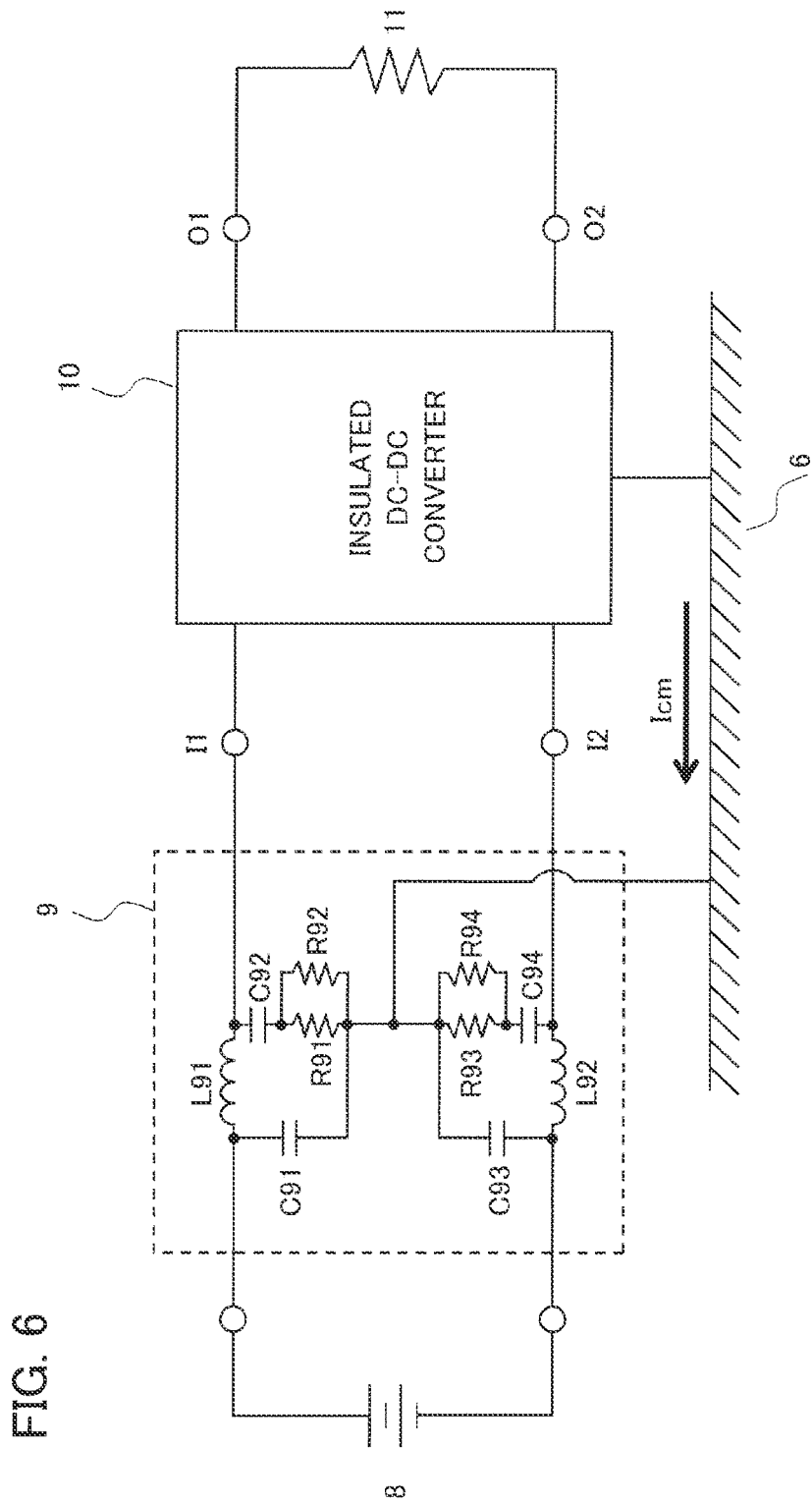
FIG. 6 is a circuit diagram illustrating a configuration of an evaluation system for measuring common mode noise generated in the switching power supply apparatus according to the first embodiment.

FIG. 6 is a circuit diagram illustrating a configuration of an evaluation system for measuring the common mode noise generated in the switching power supply apparatus according to the first embodiment. The switching power supply apparatus of FIG. 6 is provided with a DC power supply 8, a pseudo power supply circuit network 9, an isolated DC-DC converter 10, and a load resistor 11. The pseudo power supply circuit network 9 is connected between the DC power supply 8 and the isolated DC-DC converter 10, and stabilizes impedance of the DC power supply 8 seen from the isolated DC-DC converter 10. The isolated DC-DC converter 10 of FIG. 6 is configured in a manner similar to that of the isolated DC-DC converter 10 of FIG. 1. Alternatively, the switching power supply apparatus of FIG. 6 may be provided with the isolated DC-DC converter 10A of FIG. 3, in place of the isolated DC-DC converter 10 of FIG. 1.

Using the model of FIG. 6, circuit simulations were performed to estimate a difference between the currents flowing through the line-to-ground capacitances C31 and C32, that is, the current Icm flowing from the conductor portion 6 to external circuits. An effect of reducing the common mode noise by the switching power supply apparatus according to the first embodiment was verified, by comparing the currents Icm estimated under various conditions.

In the circuit simulations, the following element values of Table 1 and operation conditions of Table 2 were used.

TABLE 1

| Symbol | Element value |
| --- | --- |
| C31: | 2, 5, 8, 10 pF |
| C32: | 2, 5, 8, 10 pF |
| Combined capacitance of C21 and C22 (=C21 × C22/(C21 + C22)): | 22.5 nF |
| C11 to C44: | 1 pF each |
| L31: | 12 μH |
| L32: | 108 μH |
| L33: | 26.4 μH |
| L51: | Short circuited (0H) |
| C51: | 10 μF |
| C91, C93: | 1 μF each |
| L91, L92: | 50 μH each |
| C92, C94: | 0.1 μF each |
| R91, R93: | 50 Ω each |
| R92, R94: | 1 kΩ each |

TABLE 2

| | |
| --- | --- |
| Voltage of DC power supply 8: | 400 V |
| Switching frequency of switching elements S11 to S44: | 130 kHz each |
| Resistance of load resistor 11: | 30 Ω |

With reference to FIGS. 7 to 12, results of the circuit simulations will be described below.

Figure 7:
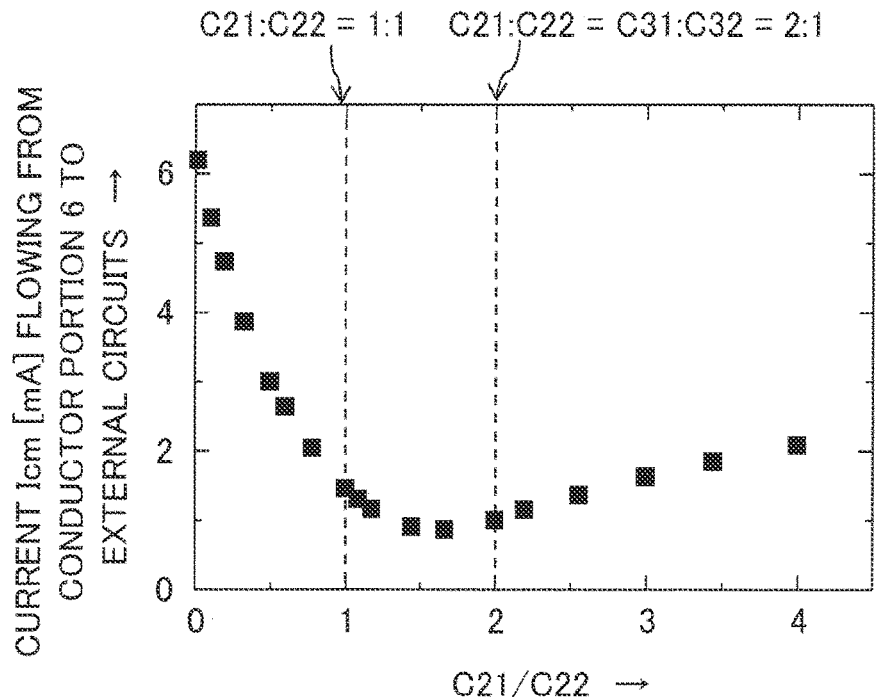
FIG. 7 is a graph illustrating characteristics of a current Icm flowing from a conductor portion 6 to external circuits, with respect to a ratio of capacitances of the capacitors C21 and C22, under an assumption that the isolated DC-DC converter 10 of the switching power supply apparatus of FIG. 6 has line-to-ground capacitance C31=10 pF and line-to-ground capacitance C32=5 pF.

FIG. 7 is a graph illustrating characteristics of a current Icm flowing from the conductor portion 6 to external circuits, with respect to a ratio of capacitances of the capacitors C21 and C22, under an assumption that the isolated DC-DC converter 10 of the switching power supply apparatus of FIG. 6 has line-to-ground capacitance C31=10 pF and line-to-ground capacitance C32=5 pF. Referring to FIG. 7, it can be seen that in a case of C21:C22=C31:C32=2:1 (C21/C22=2), it is possible to more significantly reduce the current Icm, and therefore, reduce the common mode noise, as compared with a case of using the resonant capacitors C21 and C22 with the same capacitance (C21/C22=1).

Referring to FIG. 7, the current Icm is not minimized at C21:C22=C31:C32, and this is because the voltage potentials at the nodes N1 and N2 were approximated to zero when calculating Equations (3) and (4). It results from such approximation errors, since the voltage potentials at the nodes N1 and N2 are not zero in actual circuit operations.

In addition, referring to FIG. 7, it can be seen that within the range of 1<C21/C22<3, it is possible to more significantly reduce the current Icm, and therefore, reduce the common mode noise, as compared with the case of using the resonant capacitors C21 and C22 with the same capacitance. The upper limit of the range in which the common mode noise is reduced (in this case, C21/C22=3) can not be determined a priori, since it depends on conditions regarding circuit design and/or circuit operations. However, referring to FIG. 7, it can be seen that the common mode noise can be reduced at least within the range of 1<C21/C22≤C31/C32.

Figure 8:
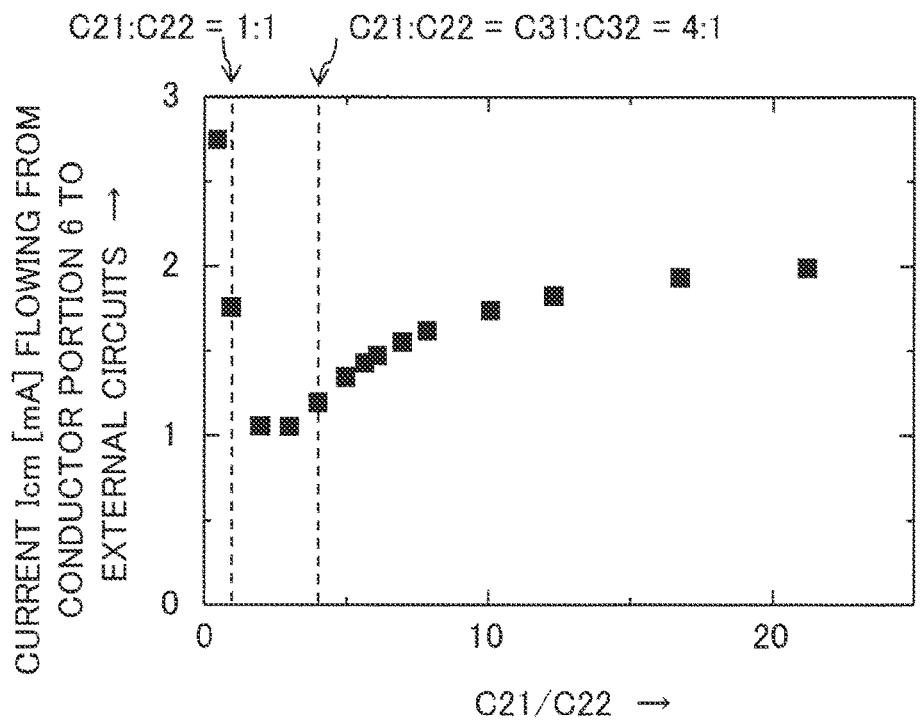
FIG. 8 is a graph illustrating characteristics of the current Icm flowing from the conductor portion 6 to external circuits, with respect to the ratio of capacitances of the capacitors C21 and C22, under an assumption that the isolated DC-DC converter 10 of the switching power supply apparatus of FIG. 6 has line-to-ground capacitance C31=8 pF and the line-to-ground capacitance C32=2 pF.
Figure 9:
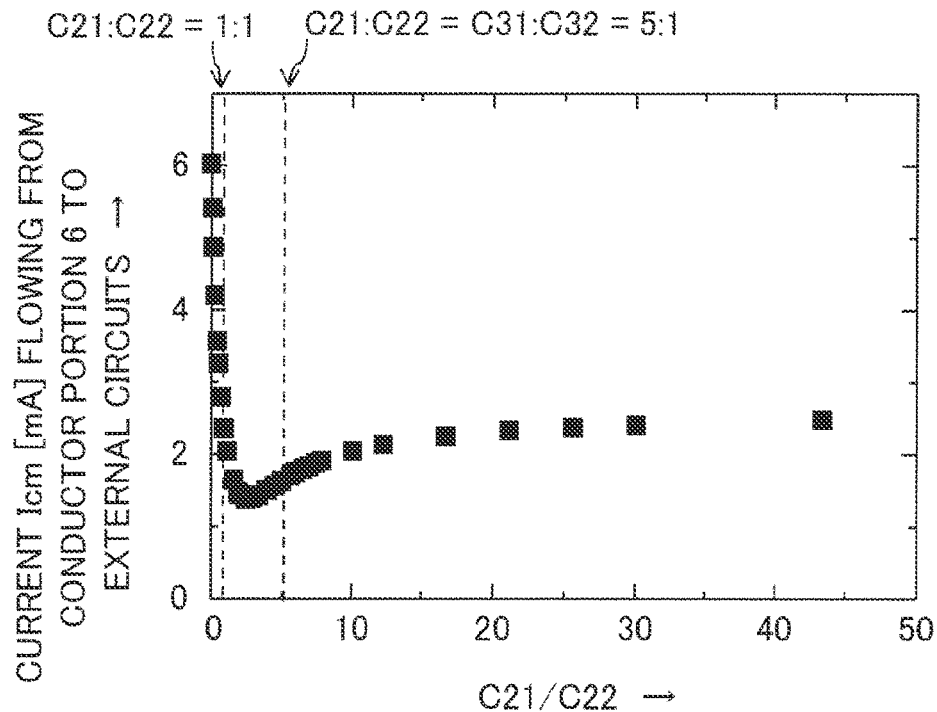
FIG. 9 is a graph illustrating characteristics of the current Icm flowing from the conductor portion 6 to external circuits, with respect to the ratio of capacitances of the capacitors C21 and C22, under an assumption that the isolated DC-DC converter 10 of the switching power supply apparatus of FIG. 6 has line-to-ground capacitance C31=10 pF and line-to-ground capacitance C32=2 pF.

FIG. 8 is a graph illustrating characteristics of the current Icm flowing from the conductor portion 6 to external circuits, with respect to the ratio of capacitances of the capacitors C21 and C22, under an assumption that the isolated DC-DC converter 10 of the switching power supply apparatus of FIG. 6 has line-to-ground capacitance C31=8 pF and the line-to-ground capacitance C32=2 pF. FIG. 9 is a graph illustrating characteristics of the current Icm flowing from the conductor portion 6 to external circuits, with respect to the ratio of capacitances of the capacitors C21 and C22, under an assumption that the isolated DC-DC converter 10 of the switching power supply apparatus of FIG. 6 has line-to-ground capacitance C31=10 pF and line-to-ground capacitance C32=2 pF. Referring to FIGS. 8 and 9, it can be seen that in the case of C21:C22=C31:C32, it is possible to more significantly reduce the current Icm, and therefore, reduce the common mode noise, as compared with the case of using the resonant capacitors C21 and C22 with the same capacitance, in a manner similar to the case of FIG. 7. In addition, referring to FIGS. 8 and 9, it can be seen that at least within the range of 1<C21/C22≤C31/C32, it is possible to more significantly reduce the current Icm, and therefore, reduce the common mode noise as compared with the case of using the resonant capacitors C21 and C22 with the same capacitance, in a manner similar to the case of FIG. 7.

According to the circuit simulations of FIGS. 7 to 9, it can be seen that by setting:

1<$C21/C22 \le C31/C32$, for $C31 > C32$, it is possible to more significantly reduce the current Icm, and therefore, reduce the common mode noise, as compared with the case of using the resonant capacitors C21 and C22 with the same capacitance.

Figure 10:
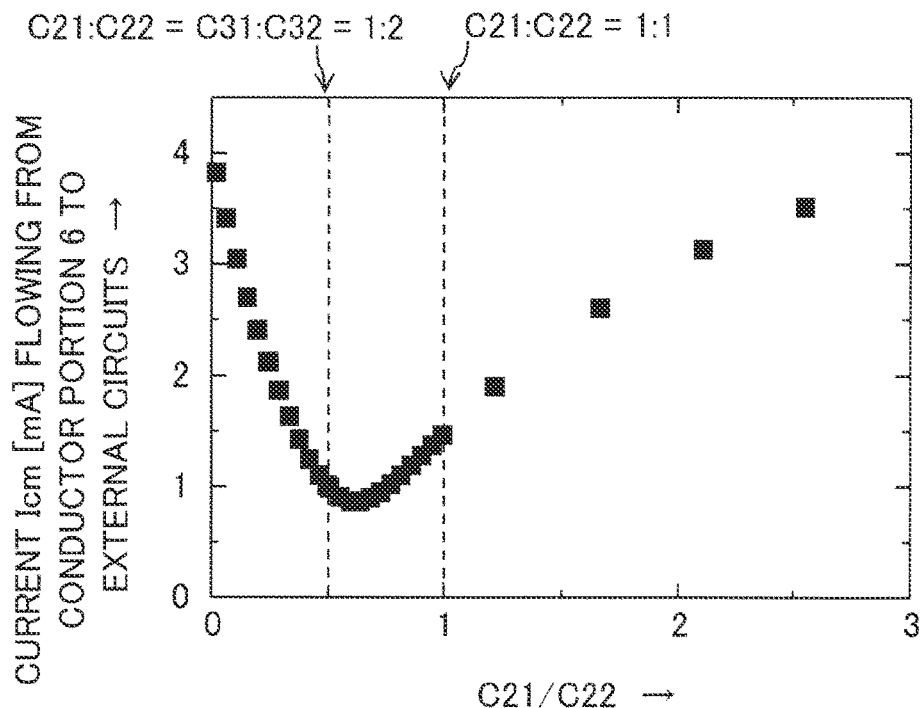
FIG. 10 is a graph illustrating characteristics of the current Icm flowing from the conductor portion 6 to external circuits, with respect to the ratio of capacitances of the capacitors C21 and C22, under an assumption that the isolated DC-DC converter 10 of the switching power supply apparatus of FIG. 6 has line-to-ground capacitance C31=5 pF and the line-to-ground capacitance C32=10 pF.

FIG. 10 is a graph illustrating characteristics of the current Icm flowing from the conductor portion 6 to external circuits, with respect to the ratio of capacitances of the capacitors C21 and C22, under an assumption that the isolated DC-DC converter 10 of the switching power supply apparatus of FIG. 6 has line-to-ground capacitance C31=5 pF and the line-to-ground capacitance C32=10 pF. Referring to FIG. 10, it can be seen that in the case of C21:C22=C31:C32=1:2(C21/C22=0.5), it is possible to more significantly reduce the current Icm, and therefore, reduce the common mode noise, as compared with the case of using the resonant capacitors C21 and C22 with the same capacitance (C21/C22=1).

Referring to FIG. 10, the current Icm is not minimized at C21:C22=C31:C32, and this is because the voltage potentials at the nodes N1 and N2 were approximated to zero when calculating Equations (3) and (4). It results from such approximation error, since the voltage potentials at the nodes N1 and N2 are not zero in actual circuit operations.

In addition, referring to FIG. 10, it can be seen that within the range of 0.33<C21/C22<1, it is possible to more significantly reduce the current Icm, and therefore, reduce the common mode noise, as compared with the case of using the resonant capacitors C21 and C22 with the same capacitance. The lower limit of the range in which the common mode noise is reduced (in this case, C21/C22=0.33) can not be determined a priori, since it depends on conditions regarding circuit design and/or circuit operations. However, referring to FIG. 10, it can be seen that the common mode noise can be reduced at least within the range of C31/C32≤C21/C22<1.

Figure 11:
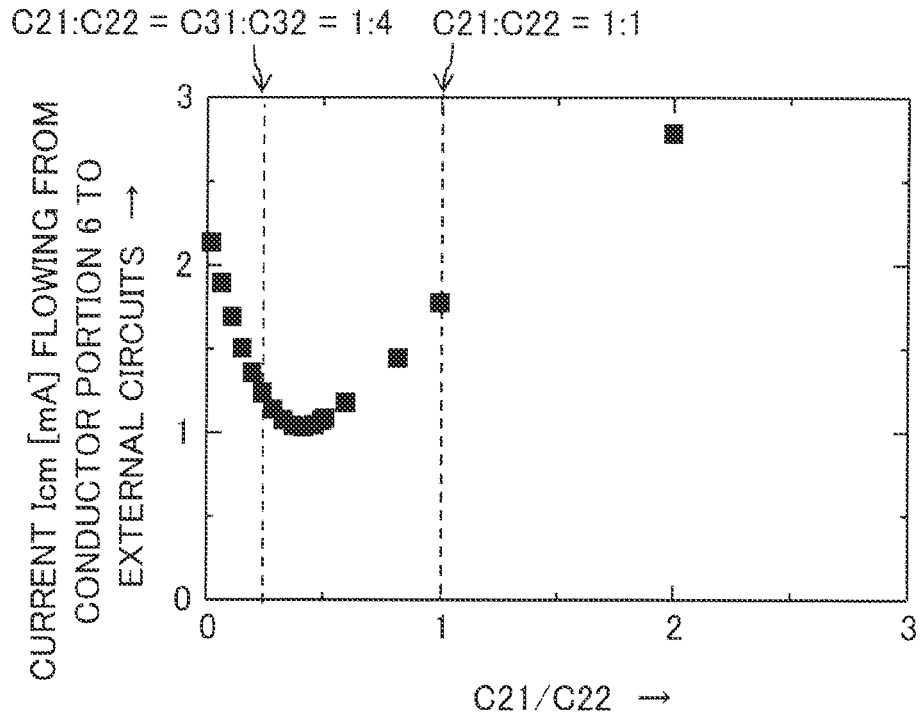
FIG. 11 is a graph illustrating a characteristics of the current Icm flowing from the conductor portion 6 to external circuits, with respect to the ratio of capacitances of the capacitors C21 and C22, under an assumption that the isolated DC-DC converter 10 of the switching power supply apparatus of FIG. 6 has line-to-ground capacitance C31=2 pF and line-to-ground capacitance C32=8 pF.
Figure 12:
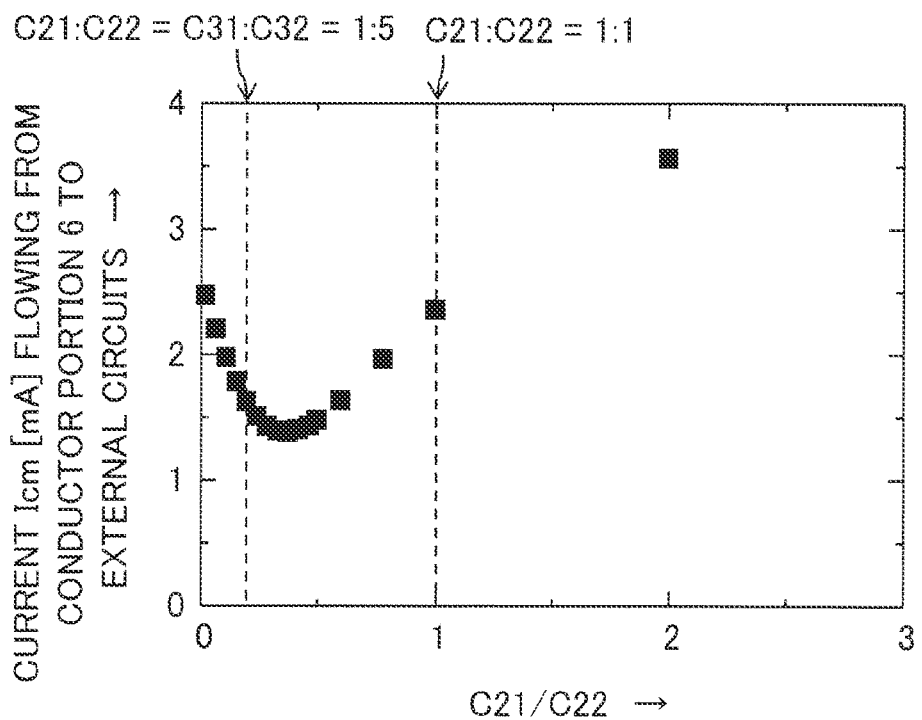
FIG. 12 is a graph illustrating characteristics of the current Icm flowing from the conductor portion 6 to external circuits, with respect to the ratio of capacitances of the capacitors C21 and C22, under an assumption that the isolated DC-DC converter 10 of the switching power supply apparatus of FIG. 6 has line-to-ground capacitance C31=2 pF and line-to-ground capacitance C32=10 pF.

FIG. 11 is a graph illustrating a characteristics of current Icm flowing from the conductor portion 6 to external circuits, with respect to the ratio of capacitances of the capacitors C21 and C22, under an assumption that the isolated DC-DC converter 10 of the switching power supply apparatus of FIG. 6 has line-to-ground capacitance C31=2 pF and line-to-ground capacitance C32=8 pF. FIG. 12 is a graph illustrating characteristics of the current Icm flowing from the conductor portion 6 to external circuits, with respect to the ratio of capacitances of the capacitors C21 and C22, under an assumption that the isolated DC-DC converter 10 of the switching power supply apparatus of FIG. 6 has line-to-ground capacitance C31=2 pF and line-to-ground capacitance C32=10 pF. Referring to FIGS. 11 and 12, it can be seen that in the case of C21:C22=C31:C32, it is possible to more significantly reduce the current Icm, and therefore, reduce the common mode noise, as compared with the case of using the resonant capacitors C21 and C22 with the same capacitance, in a manner similar to the case of FIG. 10. In addition, referring to FIGS. 11 and 12, it can be seen that at least within the range of C31/C32≤C21/C22<1, it is possible to more significantly reduce the current Icm, and therefore, reduce the common mode noise, as compared with the case of using the resonant capacitors C21 and C22 with the same capacitance, in a manner similar to the case of FIG. 10.

According to the circuit simulations of FIGS. 10 to 12, it can be seen that by setting:

$C31/C32 \le C21/C22 < 1$, for $C31 < C32$, it is possible to more significantly reduce the current Icm, and therefore, reduce the common mode noise, as compared with the case of using the resonant capacitors C21 and C22 with the same capacitance.

As described above, according to the circuit simulations of FIGS. 7 to 12, it can be seen that it is effective adjust the ratio of the capacitances of the resonant capacitors C21 and C22, in consideration of the asymmetry of the line-to-ground capacitances C31 and C32, in order to reduce the common mode noise generated in the LLC-resonant isolated DC-DC converter 10.

According to the circuit simulations of FIGS. 7 to 12, it can be seen that the capacitances of the resonant capacitors C21 and C22 are effectively set to satisfy:

$C21 > C22$, for $C31 > C32$;

$C21 = C22$, for $C31 = C32$; and $C21 < C22$, for $C31 < C32$.

In addition, according to the circuit simulations of FIGS. 7 to 12, it can be seen that the capacitances of the resonant capacitors C21 and C22 are effectively set to satisfy:

$1 < C21/C22 \le C31/C32$, for $C31 > C32$; and $1 > C21/C22 \ge C31/C32$, for $C31 < C32$.

The configuration according to the first embodiment is also applicable to a case where the line-to-ground capacitances C31 and C32 are of capacitors connected between the conductor portion 6 and both ends of the primary winding of the transformer 3, rather than the parasitic capacitances between the conductor portion 6 and both ends of the primary winding of the transformer 3.

Second Embodiment

Figure 13:
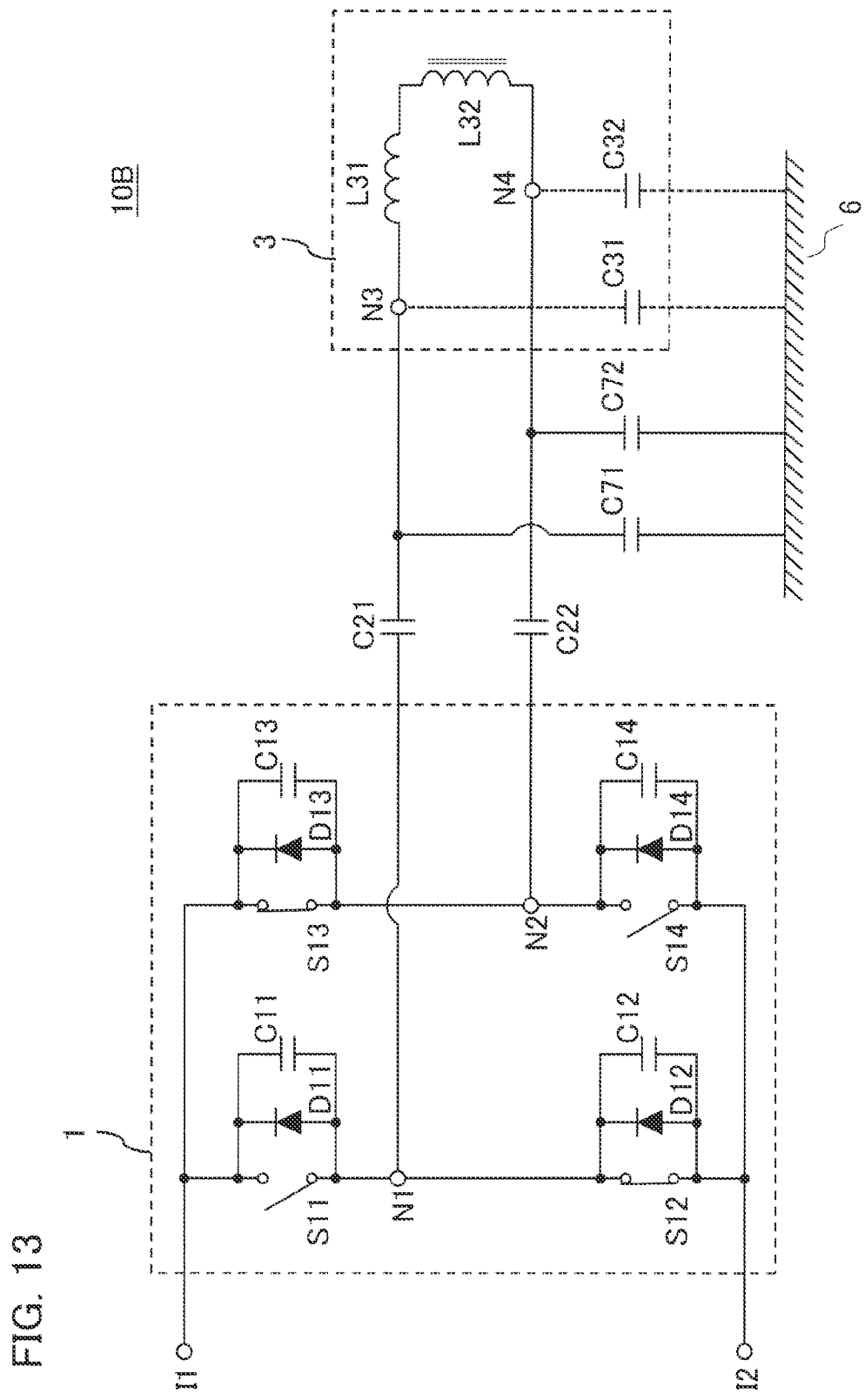
FIG. 13 is a circuit diagram illustrating a configuration of a switching power supply apparatus according to a second embodiment.

FIG. 13 is a circuit diagram illustrating a configuration of a switching power supply apparatus according to a second embodiment. The switching power supply apparatus of FIG. 13 includes an isolated DC-DC converter 10B. The isolated DC-DC converter 10B of FIG. 13 is provided with capacitors C71 and C72, in addition to the components of the isolated DC-DC converter 10 of FIG. 1 (or the isolated DC-DC converter 10A of FIG. 3). FIG. 13 does not illustrate the secondary winding and the components on the secondary side of the transformer 3.

Values of the line-to-ground capacitances C31 and C32 at both ends of the primary winding of the transformer 3 depend on the structure of the transformer 3 and/or the arrangement of the shield, and the values are, for example, on the order of several picofarads. In this case, it is difficult or impossible to measure the line-to-ground capacitances C31 and C32 with sufficient accuracy. Hence, the switching power supply apparatus according to the second embodiment is provided with additional capacitors C71 and C72 between the conductor portion 6 and both ends of the primary winding of the transformer 3, respectively, the capacitances of the capacitors C71 and C72 being, for example, on the order of several nanofarads, which is sufficiently larger than the line-to-ground capacitances C31 and C32. This reduces an influence of the line-to-ground capacitances C31 and C32.

The ratio of capacitances of the resonant capacitors C21 and C22 (C21:C22) may be set to be equal to the ratio of capacitances of the capacitors C71 and C72 (C71:C72). In this case, it is possible to reduce the common mode noise, without allowing the current flowing through the capacitors C71 and C72 to propagate from the conductor portion 6 to external circuits, in addition, without allowing the current flowing through the capacitors C31 and C32 to propagate from the conductor portion 6 to external circuits.

The capacitances of the resonant capacitors C21 and C22 may be set to satisfy:

$C21>C22$, for $C71>C72$; and $C21<C22$, for $C71<C72$.

In addition, the capacitances of the resonant capacitors C21 and C22 may be set to satisfy:

$1<C21/C22 \leq C71/C72$, for $C71>C72$; and $1>C21/C22 \geq C71/C72$, for $C71<C72$.

As described above, according to the switching power supply apparatus of the second embodiment, the common node noise can be made less likely to occur, by setting the capacitances of the resonant capacitors C21 and C22 depending on the capacitances of the capacitors C71 and C72. Thus, it is possible to reduce the number of components for reducing the common mode noise, and reduce the size and cost of the switching power supply apparatus.

The configuration according to the second embodiment is also applicable to a case where the line-to-ground capacitances C31 and C32 are of capacitors connected between the conductor portion 6 and both ends of the primary winding of the transformer 3, rather than the parasitic capacitances between the conductor portion 6 and both ends of the primary winding of the transformer 3. It is possible to increase the degree of freedom of design by combining the capacitors C31 and C32 with the capacitors C71 and C72.

Third Embodiment

Figure 14:
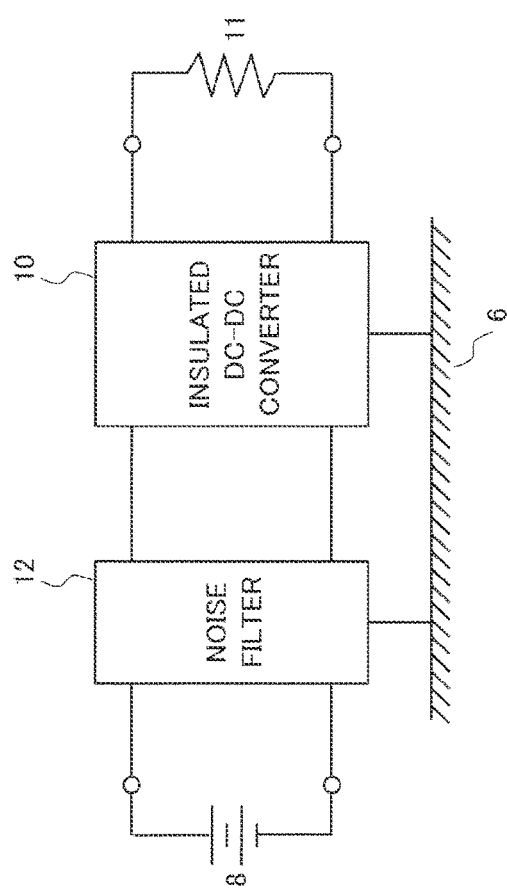
FIG. 14 is a block diagram illustrating a configuration of a switching power supply apparatus according to a third embodiment.

FIG. 14 is a block diagram illustrating a configuration of a switching power supply apparatus according to a third embodiment. The switching power supply apparatus of FIG. 14 is provided with the insulated DC-DC converter 10 of FIG. 1, and a noise filter 12. The noise filter 12 removes normal mode noises flowing in a bus of the switching power supply apparatus. The noise filter 12 is provided with a low-pass filter or a band-pass filter, for example, for removing noises generated by operations of the switching circuit 1. Although the switching power supply apparatuses of the first and fifth embodiments can make the common mode noise less likely to occur, they can not reduce the normal mode noise. On the other hand, since the switching power supply apparatus of FIG. 14 is provided with the noise filter 12, it is possible to reduce both the common mode noise and the normal mode noise.

Figure 15:
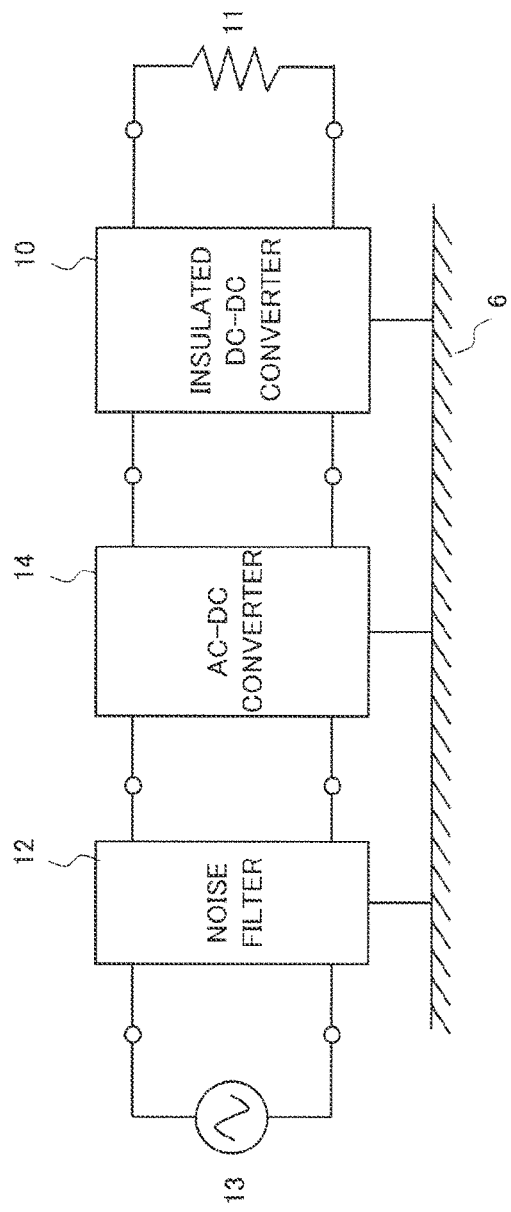
FIG. 15 is a block diagram illustrating a configuration of a switching power supply apparatus according to a modified embodiment of the third embodiment.

FIG. 15 is a block diagram illustrating a configuration of a switching power supply apparatus according to a modified embodiment of the third embodiment. The switching power supply apparatus of FIG. 15 is provided with the insulated DC-DC converter 10 of FIG. 1, a noise filter 12, and an AC-DC converter 14. The AC-DC converter 14 converts an AC voltage of an AC power supply 13, such as a commercial power supply, into a DC voltage, and supplies the DC voltage to the insulated DC-DC converter 10. The noise filter 12 removes normal mode noises flowing in a bus of the switching power supply apparatus. Since the switching power supply apparatus of FIG. 15 is provided with the noise filter 12, it is possible to reduce both the common mode noise and the normal mode noise, and can make the common mode noise and the normal mode noise less likely to propagate to the AC power supply 13.

INDUSTRIAL APPLICABILITY

The switching power supply apparatus according to the present disclosure is useful for realizing an insulated DC-DC converter with low noise, small size, and low cost, for use in industrial, on-board, or medical switching power supply apparatus or the like.

The invention claimed is:

1. A switching power supply apparatus comprising:
a switching circuit, a transformer; and a conductor portion, the switching circuit including a plurality of switching elements that form a bridge circuit,
wherein the switching circuit has first and second output terminals from which an AC voltage having a predetermined frequency is outputted, the AC voltage being converted from an inputted DC voltage,
wherein the transformer has a primary winding having first and second winding terminals to which the AC voltage generated by the switching circuit is applied,
wherein the switching power supply apparatus has a first line-to-ground capacitance between the first winding terminal of the transformer and the conductor portion, and a second line-to-ground capacitance between the second winding terminal of the transformer and the conductor portion,
wherein the switching power supply apparatus further comprises first and second capacitors, the first capacitor being connected between the first output terminal of the switching circuit and the first winding terminal of the transformer, and the second capacitor being connected between the second output terminal of the switching circuit and the second winding terminal of the transformer,
wherein capacitances of the first and the second capacitors are set to satisfy:
$C21>C22$, for $C31>C32$; and
$C21<C22$, for $C31<C32$, and
wherein C31 denotes the first line-to-ground capacitance, C32 denotes the second line-to-ground capacitance, C21 denotes capacitance of the first capacitor, and C22 denotes capacitance of the second capacitor.

2. The switching power supply apparatus as claimed in claim 1,
wherein the capacitances of the first and the second capacitors are set to satisfy:

$1 < C21/C22 < C31/C32$, for $C31 > C32$; and $1 > C21/C22 > C31/C32$, for $C31 < C32$.

3. The switching power supply apparatus as claimed in claim 1,
wherein the switching power supply apparatus further comprises third and fourth capacitors, the third capacitor being connected between the first winding terminal of the transformer and the conductor portion, and the fourth capacitor being connected between the second winding terminal of the transformer and the conductor portion,
wherein capacitances of the first and the second capacitors are set to satisfy:

$C21 > C22$, for $C71 > C72$; and $C21 < C22$, for $C71 < C72$, wherein C71 denotes capacitance of the third capacitor, and C72 denotes capacitance of the fourth capacitor.

4. The switching power supply apparatus as claimed in claim 3,
wherein the capacitances of the first and the second capacitors are set to satisfy:

$1 < C21/C22 < C71/C72$, for $C71 > C72$; and $1 > C21/C22 > C71/C72$, for $C71 < C72$.

5. The switching power supply apparatus as claimed in claim 1, wherein the conductor portion includes at least one of a ground conductor, a metal housing, a shield, or a heat sink.

6. The switching power supply apparatus as claimed in claim 1, further comprising a noise filter that removes normal mode noises.

* * * * *